(12) United States Patent
Kugler et al.

(10) Patent No.: US 9,081,296 B2
(45) Date of Patent: Jul. 14, 2015

(54) REPLACEMENT APPARATUS FOR AN OPTICAL ELEMENT

(71) Applicant: Carl Zeiss SMT GmbH, Oberkochen (DE)

(72) Inventors: Jens Kugler, Aalen (DE); Franz Sorg, Aalen (DE); Andreas Wurmbrand, Aalen (DE); Thomas Schletterer, Stadtroda (DE); Thomas Ittner, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/499,559

(22) Filed: Sep. 29, 2014

(65) Prior Publication Data

US 2015/0070789 A1 Mar. 12, 2015

Related U.S. Application Data

(60) Continuation of application No. 13/920,339, filed on Jun. 18, 2013, now Pat. No. 8,902,519, which is a continuation of application No. 13/170,951, filed on Jun. 28, 2011, now Pat. No. 8,488,261, which is a (Continued)

(30) Foreign Application Priority Data

Dec. 23, 2003 (DE) .................................. 10361441

(51) Int. Cl.
*G03F 7/20* (2006.01)
*G02B 7/02* (2006.01)

(52) U.S. Cl.
CPC .............. *G03F 7/7015* (2013.01); *G02B 7/023* (2013.01)

(58) Field of Classification Search
CPC ....................................................... G02B 7/023
See application file for complete search history.

(56) References Cited

U.S. PATENT DOCUMENTS

| 3,077,958 | A | 2/1963 | Grimsey |
| 3,802,781 | A | 4/1974 | Wright |
| 3,837,125 | A | 9/1974 | Johnson |
| 3,879,105 | A | 4/1975 | Broche et al. |
| 3,917,385 | A | 11/1975 | Caswell |
| 4,038,971 | A | 8/1977 | Bezborodko |
| 4,060,315 | A | 11/1977 | Heinz |
| 4,092,518 | A | 5/1978 | Merard |
| 4,135,778 | A | 1/1979 | Lincoln |

(Continued)

FOREIGN PATENT DOCUMENTS

| DE | 100 15 953 | 10/2000 |
| EP | 0779125 | 6/1997 |

(Continued)

OTHER PUBLICATIONS

Burns et al, "Compact, Multichannel receiver using InGaAs APDs for single pulse, eye-safe, laser radar Imagery," SPIE vol. 3065, 1997, pp. 22-29.

(Continued)

*Primary Examiner* — Joseph P Martinez
(74) *Attorney, Agent, or Firm* — Fish & Richardson P.C.

(57) ABSTRACT

A replacement apparatus for an optical element mounted between two adjacent optical elements in a lithography objective has a holder for the optical element to be replaced, which holder can be moved into the lithography objective through a lateral opening in a housing of the same.

29 Claims, 4 Drawing Sheets

Related U.S. Application Data continuation of application No. 12/830,913, filed on Jul. 6, 2010, now Pat. No. 7,995,296, which is a continuation of application No. 12/400,965, filed on Mar. 10, 2009, now Pat. No. 7,768,723, which is a continuation of application No. 11/895,990, filed on Aug. 28, 2007, now Pat. No. 7,515,363, which is a division of application No. 10/966,388, filed on Oct. 15, 2004, now Pat. No. 7,265,917.

(56) References Cited

U.S. PATENT DOCUMENTS

| | | |
|---|---|---|
| 4,162,120 A | 7/1979 | Moreno |
| 4,195,913 A | 4/1980 | Dourte et al. |
| 4,202,605 A | 5/1980 | Heinz |
| 4,226,507 A | 10/1980 | Fuschetto |
| 4,236,296 A | 12/1980 | Woolhouse et al. |
| 4,277,141 A | 7/1981 | Kleiber |
| 4,295,710 A | 10/1981 | Heinz |
| 4,348,090 A | 9/1982 | Iizuka |
| 4,380,391 A | 4/1983 | Buser et al. |
| 4,389,115 A | 6/1983 | Richter |
| 4,403,421 A | 9/1983 | Shepherd |
| 4,408,874 A | 10/1983 | Zinky et al. |
| 4,659,225 A | 4/1987 | Takahashi |
| 4,672,439 A | 6/1987 | Florence et al. |
| 4,674,874 A | 6/1987 | Halldorsson et al. |
| 4,705,369 A | 11/1987 | Humpal |
| 4,710,276 A | 12/1987 | Kull |
| 4,722,592 A | 2/1988 | Stolfi |
| 4,740,276 A | 4/1988 | Marmo et al. |
| 4,826,304 A | 5/1989 | Guch et al. |
| 4,849,668 A | 7/1989 | Crawley et al. |
| 4,865,454 A | 9/1989 | Lazzarini et al. |
| 4,871,237 A | 10/1989 | Anzai et al. |
| 4,932,770 A | 6/1990 | Caravaty |
| 4,932,778 A | 6/1990 | Parra |
| 4,953,965 A | 9/1990 | Iwase et al. |
| 4,959,531 A | 9/1990 | Marino |
| 4,967,088 A | 10/1990 | Stengl et al. |
| 4,969,726 A | 11/1990 | Koning |
| 5,025,284 A | 6/1991 | Komoriya et al. |
| 5,026,977 A | 6/1991 | Hubbard, Jr. |
| 5,074,654 A | 12/1991 | Alden et al. |
| 5,079,414 A | 1/1992 | Martin |
| 5,132,979 A | 7/1992 | Erbert |
| 5,157,555 A | 10/1992 | Reno |
| 5,204,712 A | 4/1993 | Bouwer et al. |
| 5,210,650 A | 5/1993 | O'Brien et al. |
| 5,339,720 A | 8/1994 | Pellarin et al. |
| 5,400,184 A | 3/1995 | Kuklo |
| 5,414,557 A | 5/1995 | Phillips |
| 5,428,482 A | 6/1995 | Bruning et al. |
| 5,438,451 A | 8/1995 | Schweizer |
| 5,485,053 A | 1/1996 | Baz |
| 5,529,277 A | 6/1996 | Ostaszewski |
| 5,537,262 A | 7/1996 | Aoki et al. |
| 5,638,223 A | 6/1997 | Ikeda |
| 5,642,237 A | 6/1997 | Miyawaki et al. |
| 5,694,257 A | 12/1997 | Arnone et al. |
| 5,702,622 A | 12/1997 | Schubert et al. |
| 5,719,846 A | 2/1998 | Matoba et al. |
| 5,724,017 A | 3/1998 | Pla et al. |
| 5,784,355 A | 7/1998 | Abe |
| 5,870,133 A | 2/1999 | Naiki |
| 5,891,317 A | 4/1999 | Teichmann et al. |
| 5,986,795 A | 11/1999 | Chapman et al. |
| 5,986,827 A | 11/1999 | Hale |
| 6,054,784 A | 4/2000 | Sperling et al. |
| 6,108,121 A | 8/2000 | Mansell et al. |
| 6,144,511 A | 11/2000 | Umetsu et al. |
| 6,160,628 A | 12/2000 | Inoue |
| 6,166,868 A | 12/2000 | Holderer et al. |
| 6,208,407 B1 | 3/2001 | Loopstra |
| 6,229,657 B1 | 5/2001 | Holderer et al. |
| 6,246,822 B1 | 6/2001 | Kim et al. |
| 6,252,334 B1 | 6/2001 | Nye et al. |
| 6,252,648 B1 | 6/2001 | Hase et al. |
| 6,252,712 B1 | 6/2001 | Furter et al. |
| 6,259,571 B1 | 7/2001 | Holderer et al. |
| 6,268,904 B1 | 7/2001 | Mori et al. |
| 6,275,344 B1 | 8/2001 | Holderer |
| 6,290,363 B1 | 9/2001 | Masutani |
| 6,296,811 B1 | 10/2001 | Sasaki |
| 6,307,688 B1 | 10/2001 | Merz et al. |
| 6,337,484 B1 | 1/2002 | Loopstra et al. |
| 6,341,006 B1 | 1/2002 | Murayama et al. |
| 6,369,959 B1 | 4/2002 | Trunz et al. |
| 6,373,552 B1 | 4/2002 | Braat et al. |
| 6,392,825 B1 | 5/2002 | Trunz et al. |
| 6,405,533 B1 | 6/2002 | Rastegar et al. |
| 6,411,368 B1 | 6/2002 | Matsumoto et al. |
| 6,411,426 B1 | 6/2002 | Meehan et al. |
| 6,428,173 B1 | 8/2002 | Dhuler et al. |
| 6,445,516 B2 | 9/2002 | Osterried |
| 6,449,106 B1 * | 9/2002 | Spinali .................. 359/811 |
| 6,473,247 B1 | 10/2002 | Keller et al. |
| 6,478,434 B1 | 11/2002 | Streetman et al. |
| 6,496,466 B1 | 12/2002 | Lee et al. |
| 6,501,605 B2 | 12/2002 | Moriya |
| 6,503,383 B1 | 1/2003 | Holderer et al. |
| 6,509,670 B2 | 1/2003 | Jeong et al. |
| 6,521,892 B2 | 2/2003 | Emanuel et al. |
| 6,537,479 B1 | 3/2003 | Colea |
| 6,552,862 B2 | 4/2003 | Dieker |
| 6,566,627 B2 | 5/2003 | Brandinger et al. |
| 6,580,570 B2 | 6/2003 | Becker et al. |
| 6,585,379 B2 | 7/2003 | Yokoyama et al. |
| 6,594,057 B1 | 7/2003 | Drake et al. |
| 6,603,615 B2 | 8/2003 | Melzer et al. |
| 6,614,504 B2 | 9/2003 | Aoki et al. |
| 6,628,371 B1 | 9/2003 | Ishikawa |
| 6,633,107 B1 | 10/2003 | Calabro et al. |
| 6,646,713 B2 | 11/2003 | Ishii |
| 6,653,887 B2 | 11/2003 | Haeusser-Boehm et al. |
| 6,727,984 B2 | 4/2004 | Becht |
| 6,729,062 B2 | 5/2004 | Thomas et al. |
| 7,265,917 B2 | 9/2007 | Kugler et al. |
| 7,768,723 B2 | 8/2010 | Kugler et al. |
| 7,995,296 B2 | 8/2011 | Kugler et al. |
| 8,488,261 B2 | 7/2013 | Kugler et al. |
| 8,902,519 B2 | 12/2014 | Kugler et al. |
| 2002/0000142 A1 | 1/2002 | Hanitzch |
| 2002/0001903 A1 | 1/2002 | Borel et al. |
| 2002/0163741 A1 | 11/2002 | Shibazaki |
| 2002/0167740 A1 | 11/2002 | Osterried et al. |
| 2002/0176094 A1 | 11/2002 | Petasch et al. |
| 2003/0128349 A1 | 7/2003 | Unno |
| 2009/0168207 A1 | 7/2009 | Kugler et al. |
| 2010/0271716 A1 | 10/2010 | Kugler et al. |
| 2011/0255181 A1 | 10/2011 | Kugler et al. |
| 2013/0279029 A1 | 10/2013 | Kugler et al. |

FOREIGN PATENT DOCUMENTS

| | | |
|---|---|---|
| EP | 0874283 | 10/1999 |
| WO | WO86 05281 | 9/1986 |
| WO | WO99 66542 | 12/1999 |

OTHER PUBLICATIONS

Ellis, "Low-cost Bimorph Mirrors in Adaptice Optics," Imperial College of Science, Technology & Medicine, University of London, 1999.

Krug at al, Application of a 6x8 Silicon APD Array and Hybrid Electronics for Scannerless 3D Imaging Ladar, NATO/IRIS Active Systems, 1995, vol. II, pp. 79-89.

Roe et al., "Vibration Control if Plates Using Self-Sensing Active Constrained Layer Damping," SPIE vol. 3672, 1999, pp. 200-209.

Sato et al, "Transmission-type PVDF 2-D optical phase modulator," Applied Optics, vol. 20, No. 2, 1981, pp. 343-350.

(56) References Cited

OTHER PUBLICATIONS

Sato et al., "Adaptive PVDF piezoelectric deformable mirror systems," Applied Optics, vol. 19, No. 9, 1980, pp. 1430-1434.

Sato et al., "Multilayered deformable mirror using PVDF films," Applied Optics, vol. 21, No. 20, 1982, pp. 3664-3668.

Schulz et al, "Calibration of an interferometer for testing cylindrical surfaces," 1995 Elsevier Science, pp. 512-520.

* cited by examiner

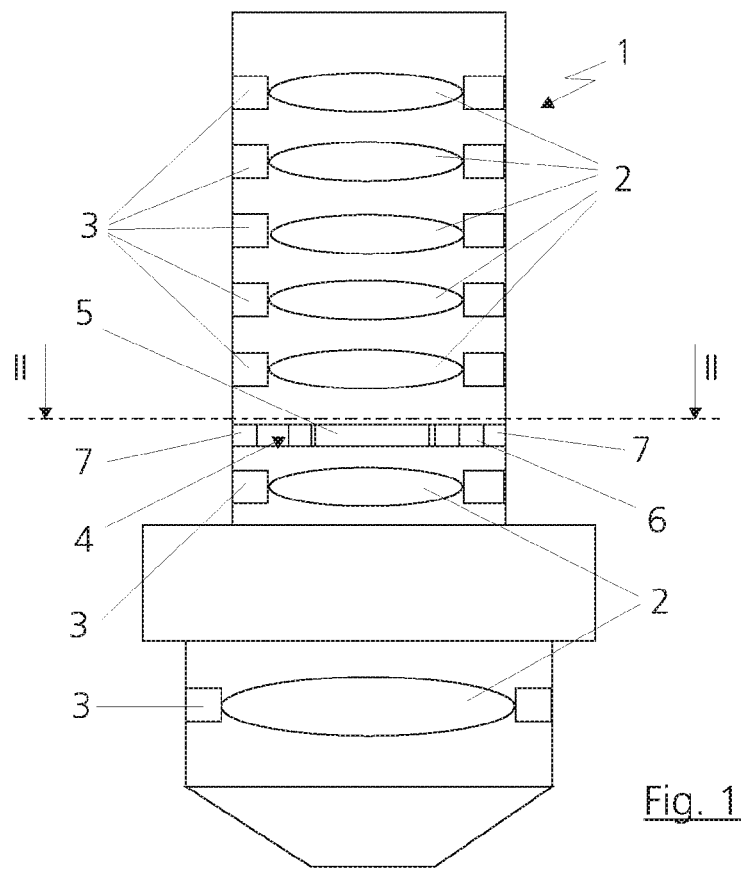
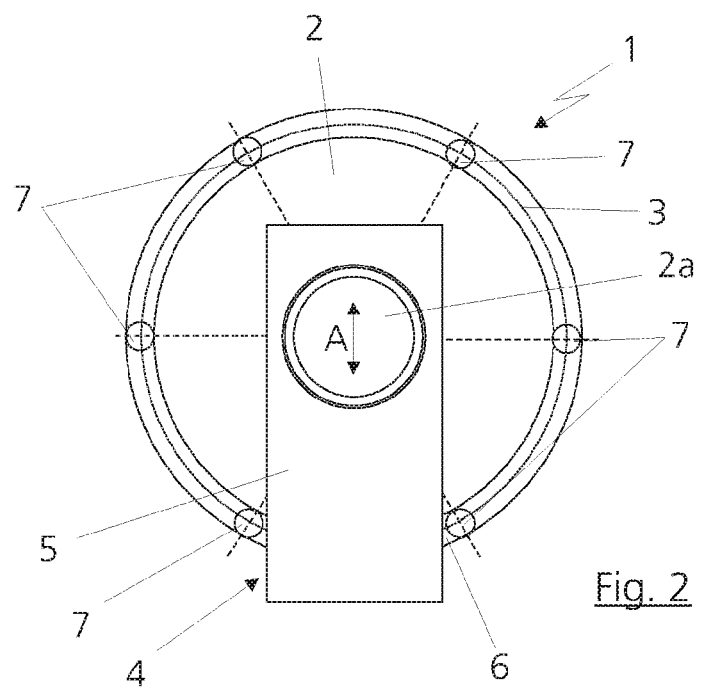

REPLACEMENT APPARATUS FOR AN OPTICAL ELEMENT

CROSS REFERENCE TO RELATED APPLICATION

This application is a continuation application of U.S. patent application Ser. No. 13/920,339, filed Jun. 18, 2013, which is a continuation of U.S. patent application Ser. No. 13/170,951, filed Jun. 28, 2011, now U.S. Pat. No. 8,488,261, which is a continuation of U.S. patent application Ser. No. 12/830,913, filed Jul. 6, 2010, now U.S. Pat. No. 7,995,296, which is a continuation of U.S. patent application Ser. No. 12/400,965, filed Mar. 10, 2009, now U.S. Pat. No. 7,768,723, which is a continuation application of U.S. patent application Ser. No. 11/895,990 filed on Aug. 28, 2007, now U.S. Pat. No. 7,515,363, which is a divisional application of U.S. patent application Ser. No. 10/966,388 filed on Oct. 15, 2004, now U.S. Pat. No. 7,265,917 B2, and which claims priority to German Patent Application No. 103 61 441.9, filed on Dec. 23, 2003, all the disclosures of which are incorporated herein by reference.

BACKGROUND OF THE INVENTION

1. Field of the Invention

The invention relates to a replacement apparatus for an optical element arranged between two adjacent optical elements in a lithography objective. Furthermore, the invention relates to a lithography objective.

2. Description of the Prior Art

Lithography objectives are known in which the last optical element, that is to say the one located closest to the wafer to be exposed, is replaceable.

Furthermore, projection objectives exist in which lens barrels are held in a support structure and can be replaced in their entirety. In order to make this possible, it is necessary to break down the entire structure of the objective.

With regard to the prior art relating to the invention, reference is made to the documents US 2002/0167740 A1 and U.S. Pat. No. 6,449,106 B1.

If the optical elements within a lithography objective, such as lenses or mirrors, for example, change over the course of time and impair the performance of the objective in such a way that the intended lifetime of the same cannot be achieved, it should be possible to remove an appropriately selected optical element within the objective and, for this, to insert a new, appropriately machined optical element, which compensates for the imaging errors of, the other optical elements. The known procedures and apparatus for replacing the last optical element are not suitable for this purpose, however.

SUMMARY OF THE INVENTION

It is therefore an object of the present invention to provide a replacement apparatus for an optical element mounted between two adjacent optical elements in a lithography objective, which permits such a replacement.

According to the invention, for this purpose, a replacement apparatus is provided for an optical element mounted between two adjacent optical elements in a lithography objective, having a holder for the optical element to be replaced, which holder can be moved into the lithography objective through a lateral opening in a housing of the same.

This replacement apparatus is capable of removing the optical element from the lithography objective and of moving another optical element, matched specifically to the changes within the lithography objective, into the lithography objective again. By these means, the imaging performance of the lithography objective can be improved considerably without any intervention in the structure of the lithography objective. All that is necessary is a lateral opening in the housing of the lithography objective, which is dimensioned such that the holder can move into the housing. In this case, the holder is capable of positioning the optical element very accurately within the lithography objective.

The replacement apparatus according to the invention may be used particularly advantageously in a lithography objective comprising a plurality of optical elements. Suitable for this purpose is a lithography objective having a plurality of optical elements, at least one replacement apparatus for an optical element mounted between two adjacent optical elements, and having a holder for the optical element to be replaced, which holder can be moved into the lithography objective through a lateral opening in a housing of the same.

Various exemplary embodiments of the invention are illustrated in principle below by using the drawing.

BRIEF DESCRIPTION OF THE DRAWINGS

FIG. 1 shows a lithography objective having a plurality of optical elements and a replacement apparatus;

FIG. 2 shows a section along the line II-II from FIG. 1 with a first embodiment of the replacement apparatus;

DETAILED DESCRIPTION

Figure 3:
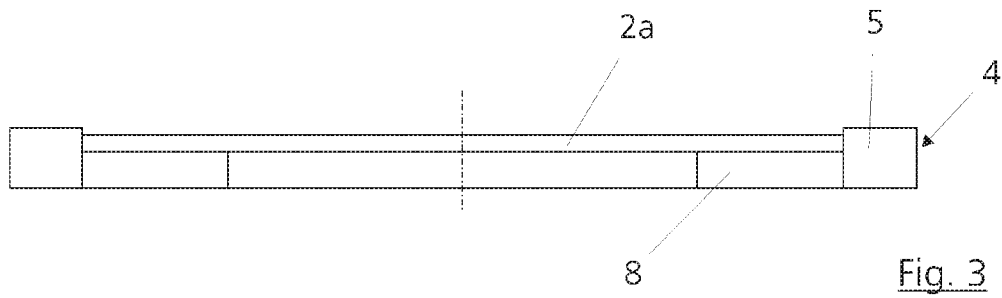
FIG. 3 shows the optical element with a stiffening element.

FIG. 1 shows lithography objective 1 with a housing 1a, in which, in a manner known per se, a plurality of optical elements 2, such as lenses, plates or mirrors for example, are arranged. The arrangement of the optical elements 2 within the lithography objective 1 should in this case be seen as purely exemplary. The lithography objective 1 can be suitable for any type of lithography and can be part of an exposure apparatus not shown in its, entirety in the drawings. Using the lithography objective 1 illustrated, it is possible, as described below, to replace an optical element 2a which is mounted or held between two adjacent optical elements 2 preferably installed permanently in the lithography objective 1 by means of respective mounts 3 and thus not replaceable. The replaceable optical element 2a, which is preferably likewise a lens, a plate or a mirror, can be seen in the sectional illustration according to FIG. 2 and is preferably located in a pupil region of the lithography objective 1. As a result, the replaceable optical element 2a can be designed with a particularly small diameter as compared with the other optical elements 2. However, the replaceable optical element 2a can be located at any other point between two adjacent optical elements 2 installed in the lithography objective 1.

In order to replace the optical element 2a, a replacement apparatus 4 is provided, which can likewise be seen better in FIG. 2. The replacement apparatus 4 has a holder 5 for the optical element 2a, which can be moved into the lithography objective 1 through a lateral opening 6 in the housing 1a of the lithography objective 1. In the present embodiment, illustrated very simplified, the opening 6 is formed by a plurality of spacer elements 7 on the periphery of the housing 1a. If, as described above, the replaceable optical element 2a is located in the pupil region of the lithography objective 1, this permits a correspondingly small size of the holder 5 and, accordingly, also of the opening 6. It is to be preferred if the spacer elements 7 are arranged symmetrically, in order not to impair the dynamic behavior of the lithography objective 1 in an impermissible way. The maximum diameter of an optical element 2a to be replaced is given by three spacer elements 7.

In order to replace or change the optical element 2a, the holder 5 moves through the opening 6 into the lithography objective 1 and removes the optical element 2a to be replaced. After the holder 5 has left the lithography objective 1 through the opening 6 again, the optical element 2a can be removed from the holder 5 outside the lithography objective 1. Then, with the aid of tools, not illustrated, outside the lithography objective 1, a new optical element 2a is inserted into the holder 5 and the holder 5 moves through the opening 6 into the housing 1a of the lithography objective 1. The movement of the holder 5 is in each case indicated by the arrow designated "A".

The newly introduced optical element 2a has previously been machined exactly to the requirements within the lithography objective 1 and is capable of compensating for imaging errors which have resulted over the time of use of the lithography objective 1. The measures taken on the optical element 2a for this purpose can be intrinsically known and should therefore not be part of the present application. Following the positioning of the optical element 2a within the lithography objective 1, the holder 5 leaves the lithography objective 1 again through the opening 6.

FIG. 3 shows the replaceable optical element 2a, which is connected to a stiffening element 8. The stiffening element 8, which is ring-like in the embodiment illustrated, preferably consists of substantially the same optical material as the replaceable optical element 2a, of $SiO_2$ in the present case, and is used to stiffen the optical element 2a, in particular during the transport of the same. The stiffening element 8 is particularly expedient in the case of flexible optical elements 2a. Of course, the optical element 2a can also consist of $CaF_2$ or another suitable optical material.

The connection of the stiffening element 8 to the replaceable optical element 2a can be made by wringing, by adhesive bonding, by soldering or in another suitable manner. If the stiffening element 8 does not consist of the same optical material as the optical element 2, then it should preferably have an approximately identical coefficient of thermal expansion to the optical element 2a. If this is not the case either, then a connection between the stiffening element 8 and the optical element 2a via solid-body linkages, not illustrated, can be provided. Furthermore, it is also possible to hold the optical element 2a in its own mount.

From FIG. 3, it is further possible to see that the holder 5 acts both on the optical element 2a and on the stiffening element 8. Of course, the holder 5 can also act only on the stiffening element 8.

Figure 4:
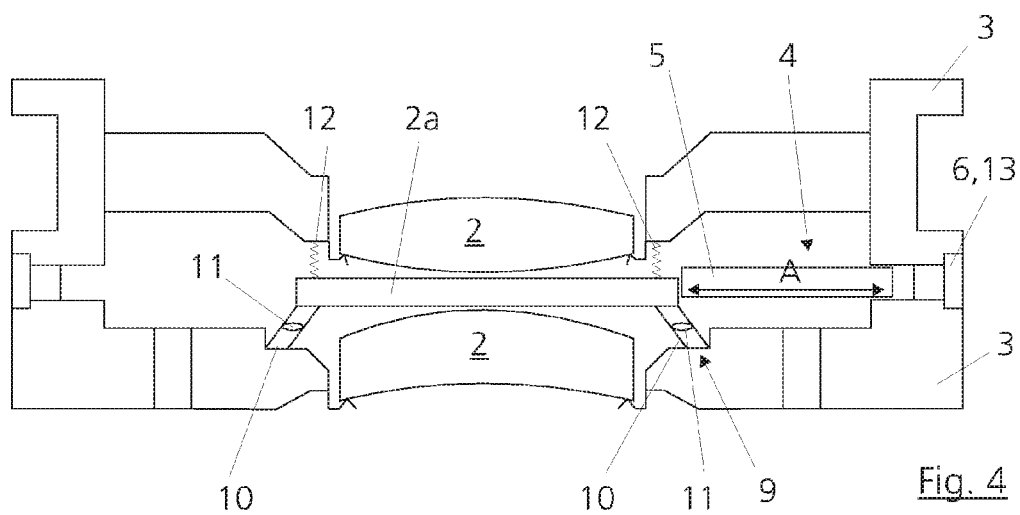
FIG. 4 shows a second embodiment of the replacement apparatus.

A second embodiment of the replacement apparatus 4 is illustrated in FIG. 4. Once again, the replaceable optical element 2a is arranged between two optical elements 2 mounted in the lithography objective 1 by means of respective mounts 3. In order to hold and to mount the optical element 2a within the lithography objective 1, use is made of a separate holding structure 9 which, in this case, is placed on mount 3 of the adjacent optical element 2a, which is located underneath the replaceable optical element 2a. Although this is not illustrated, the optical element 2a could also be provided with the stiffening element 8 in this case. The separate holding structure 9 preferably has three supports 10, of which only two can be seen in the illustration according to FIG. 4. To this extent, this is an isostatic mounting of the optical element 2a within the lithography objective 1. In addition, the separate holding structure 9 has a plurality of actuators 11, which are capable of aligning the optical element 2a in particular in the z-direction, that is to say in the direction of the optical axis of the lithography objective 1, tilting of the optical element 2a also being possible. In the present case, each support 10 is assigned to one of the actuators 11. Of course, only one actuator 11 could also be provided and, furthermore, it would be possible to accommodate respective manipulators in the holding structure 9 instead of the actuators 11.

In order to hold and to mount the optical element 2a in a defined manner within the lithography objective 1 following its replacement and to secure the same, plurality of spring elements 12 are provided which, in the present case, are supported on the mount 3 of the optical element 2 arranged above the replaceable optical element 2a. The spring elements 12 can be controllable by means of devices, not illustrated, in order, following the deposition of the optical element 2a on the holding structure 9, to press the same against the holding structure 9 and, in this way, to ensure accurate positioning of the optical element 2a in the z-direction, that is to say in the direction of the optical axis of the lithography objective 1. If appropriate, only one spring element 12 acting on the optical element 2a could also be provided. In order to deposit the optical element 2a on the holding structure 9, a movement of the holder 5 in the z-direction can be necessary. Thus, the holding structure 9, like the aforementioned mount as well, is used to mount the optical element 2a in the lithography objective 1 during the use of the same.

FIG. 4 further reveals that the opening 6 in the housing 1a can be closed by a seal 13. In the embodiment according to FIG. 4, this is a solid material seal or gasket, various embodiments of the seal 13 being explained later. The seal 13 preferably remains in place during the operation of the lithography objective 1 and is removed only in order to make the opening 6 accessible to the holder 5 in order to replace the optical element 2a.

Figure 5:
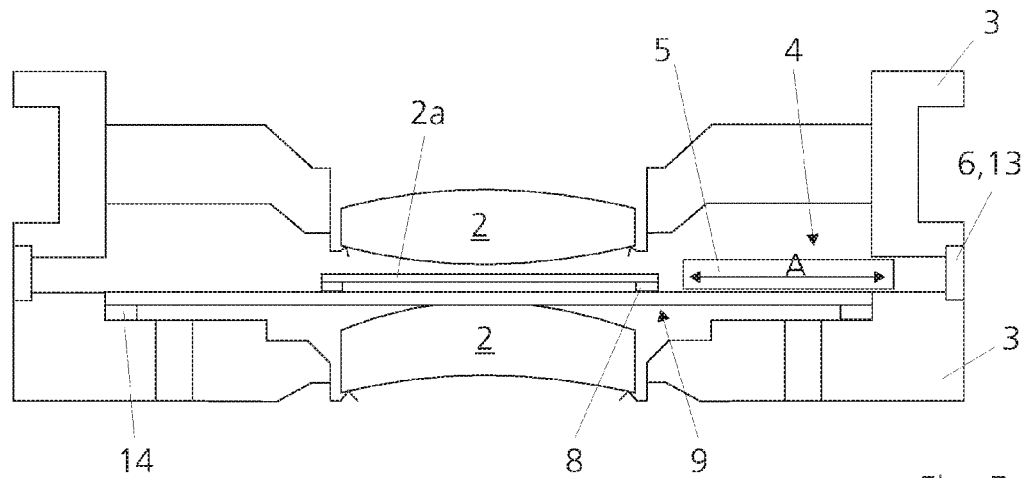
FIG. 5 shows a third embodiment of the replacement apparatus.

In the embodiment of the replacement apparatus 4 according to FIG. 5, the replaceable optical element 2a is again provided with the stiffening element 8. In a way similar to that in the embodiment according to FIG. 4, the holding structure 9 is also provided here, and is again supported on the mount 3 of that optical element 2 which is located underneath the replaceable optical element 2a. Instead of the supports 10, the holding structure 9 is in this case provided with a mount 14 which rests on the mount 3. Of course, the spring elements 12 or the at least one spring element 12 could act on the optical element 2a in this embodiment as well.

In an embodiment which is not illustrated, the replaceable optical element 2a could also rest directly on the mount 3 of the optical element 2 located underneath. In this case, attracting the optical element 2a by means of vacuum, and therefore corresponding fixing, is possible.

Figure 6:
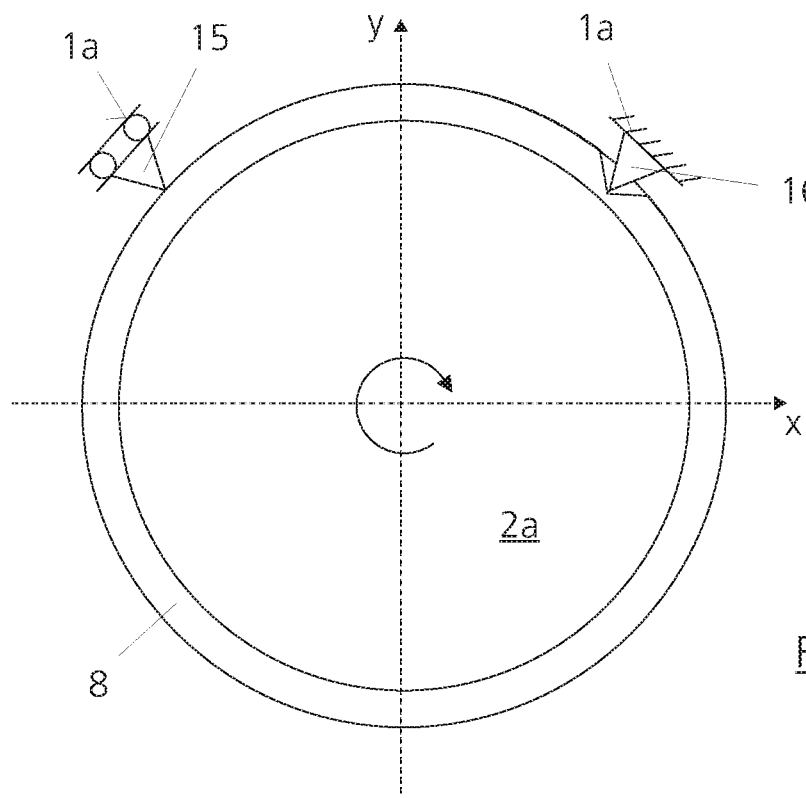
FIG. 6 shows a schematic representation of the mounting of the optical element.

FIG. 6 shows an illustration of the principle of one possible way of mounting the optical element 2a within the housing 1a of the lithography objective 1. The optical element 2a is again provided with the stiffening element 8 and, via the stiffening element 8, is mounted with respect to the housing 1a by means of a loose bearing 15 and a fixed bearing 16 with the effect of an isostatic mounting. Both the loose bearing 15 and the fixed bearing 16 can consist of hard metal, of hardened steel or of a precious stone, for example of ruby.

Figures 7, 8:
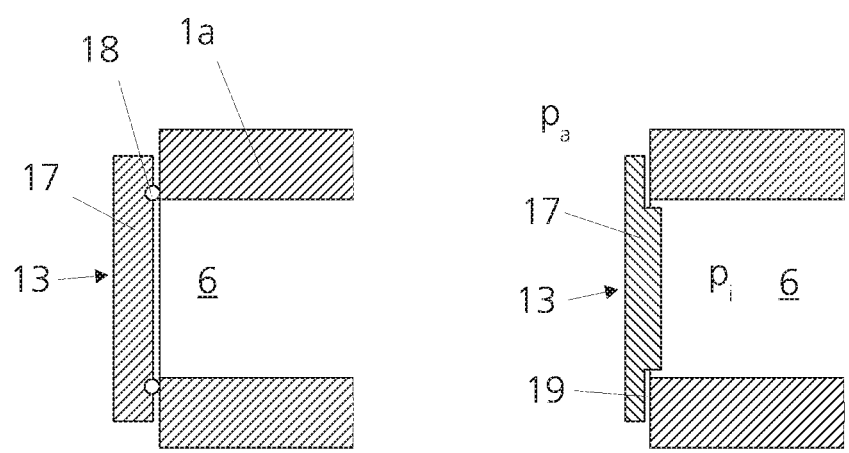
FIG. 7 shows a first embodiment of a seal for the opening in the housing of the lithography objective.
FIG. 8 shows a second embodiment of a seal for the opening in the housing of the lithography objective.

A first embodiment of the seal 13 for sealing the opening 6 of the housing 1a is illustrated in FIG. 7. In this case, a cover plate 17 is provided, which is sealed with respect to the housing is via an O-ring 18. In this way, contamination of the interior of the housing 1a of the lithography objective 1 is prevented, at the same time the accessibility of the opening 6 being ensured. Instead of the solid material seal, an elastic gasket or a metal seal or a Viton seal can also be used. If a metal seal is used, its material can for example be copper.

The embodiment of the seal 13 according to FIG. 8 is a gas seal or a gas-dynamic restrictor, which is based on the principle that, by means of the pressure $p_i$ within the housing 1a of the lithography objective 1, which is increased by comparison with the pressure $P_a$ outside the housing 1a, no gaseous substances or other contaminants can penetrate into the housing 1a. For this purpose, the cover plate 17 is again provided to be fastened opposite the housing 1a with a slit 19 which has a width from about 1 to 10 μm. In order to prevent contaminating substances being able to get into the interior of the lithography objective 1, care must merely be taken that the pressure $p_i$ in the interior of the housing 1a is greater than the pressure $p_a$ outside the housing 1a and, in this way, a directed flow takes place from the interior of the lithography objective 1 to the outside.

Figure 9:
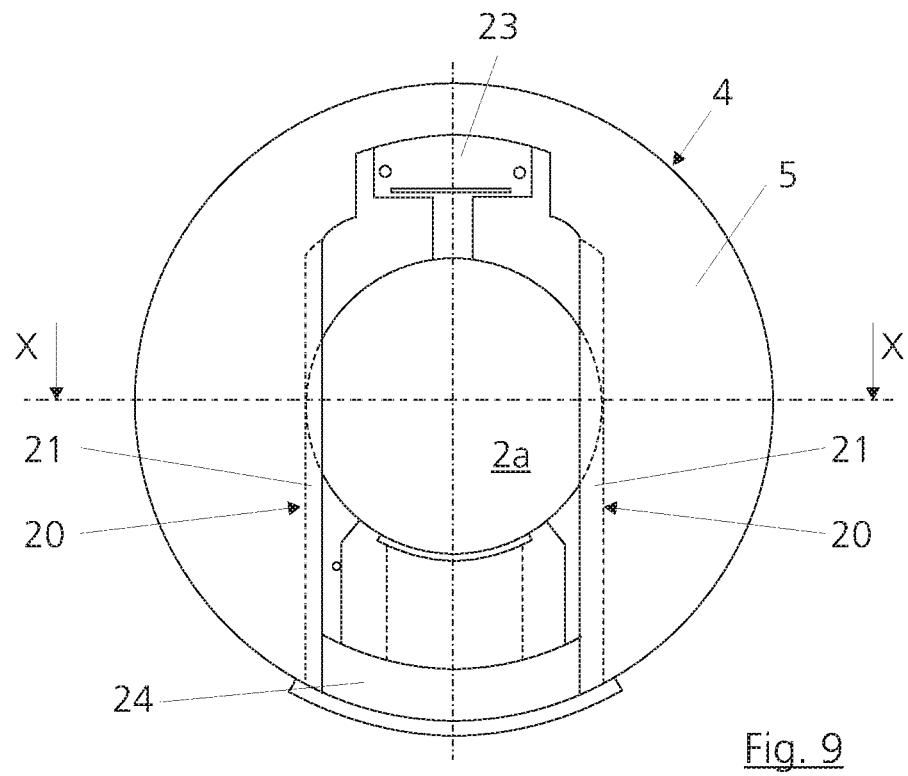
FIG. 9 shows a fourth embodiment of the replacement apparatus.
Figure 10:
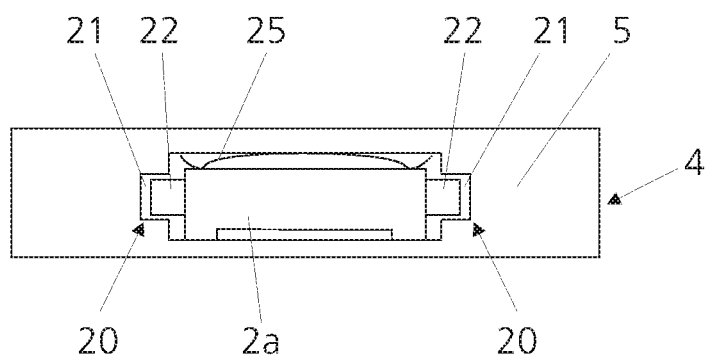
FIG. 10 shows a view in accordance with the arrow from FIG. 9.

FIGS. 9 and 10 show a further embodiment of the replacement apparatus 4 for replacing the optical element 2a. In this case, the holder 5 of the replacement apparatus 4 has a guide 20 in the form of two lateral grooves 21, into which respective lateral protrusions 22 belonging to the optical element 2a engage. The lateral protrusions 22 are not absolutely necessary, however. In the case of a planar plate, the optical element 2a can be guided with its edge in the grooves 21. In the present case, as can be seen in FIG. 10, the grooves 21 and the protrusions 22 are rectangular, but could also have any other suitable cross section. The movement of the optical element 2a into the holder 5 is limited by a spring bearing 23 which, together with a fixed bearing 24 on the open side of the holder 5, ensures exact positioning of the optical element 2a inside the holder 5. At the same time, the fixed bearing 24 serves as a closure for the holder 5. To this extent, the grooves 21 serve only to guide the optical element 2a during the replacement, whereas the position of the optical element 2a is determined by the spring bearing 23 and the fixed bearing 24. Of course, the fixed bearing 24 can be provided with a suitable seal similar to the seal 13 in order to close the opening 6 when the holder 5 is located inside the lithography objective 1. Furthermore, a spring element 25 is provided which, similarly to the spring elements 12 according to the embodiment of FIG. 4, ensures accurate positioning of the optical element 2a in the z-direction.

In this embodiment, provision is made for the holder 5 to remain within the lithography objective 1 during the transport and during the operation of the same and hence, in addition to the possibility of replacing the optical element 2a, also forms a mount for the same. If appropriate, the holder 5 could also remain within the lithography objective 1 in the other embodiments, if measures suitable for this purpose are taken.

The lithography objective 1 described above can be part of an exposure apparatus and is provided for manufacturing microstructured components such as wafers.

What is claimed is:

1. An optical system with an optical axis, the optical system comprising:
    a housing having an interior, an exterior and an opening;
    a first optical element;
    a mount configured to secure the first optical element in the interior of the housing;
    a holding structure disposed on the mount;
    a second optical element disposed on the holding structure; and
    a holder configured to move in a direction of the optical axis and between the interior of the housing and the exterior of the housing via the opening in the housing, wherein:
        the holder is configured to move the second optical element from the exterior of the housing to the interior of the housing; and
        the optical system is a microlithography optical system.

2. The optical system of claim 1, wherein the holding structure comprises an actuator configured to align the second optical element.

3. The optical system of claim 1, wherein the second optical element is located in a pupil region of the optical system.

4. The optical system of claim 1, wherein the second optical element is configured to compensate for imaging errors of the optical system.

5. The optical system of claim 1, wherein the second optical element has a maximum diameter that is at most 0.866 times an inner diameter of the housing.

6. The optical system of claim 1, further comprising a third optical element, wherein the first and third optical elements are non-replaceable optical elements, and the second optical element is a single optical element arranged between the first and second optical elements.

7. The optical system of claim 1, wherein the optical system is a microlithography objective.

8. An optical system, comprising:
    a housing having an interior, an exterior and an opening;
    a first optical element;
    a mount configured to secure the first optical element in the interior of the housing;
    a holding structure disposed on the mount, the holding structure comprising an actuator;
    a second optical element disposed on the holding structure; and
    a holder configured to move between the interior of the housing and the exterior of the housing via the opening in the housing, wherein:
        the actuator is configured to align the second optical element;
        the holder is configured to move the second optical element from the exterior of the housing to the interior of the housing; and
        the optical system is a microlithography optical system.

9. The optical system of claim 8, wherein the holder is configured to move in a direction of an optical axis of the optical system.

10. The optical system of claim 8, wherein the second optical element is configured to compensate for imaging errors of the optical system.

11. The optical system of claim 8, wherein the second optical element has a maximum diameter that is at most 0.866 times an inner diameter of the housing.

12. The optical system of claim 8, further comprising a third optical element, wherein the first and third optical elements are non-replaceable optical elements, and the second optical element is a single optical element arranged between the first and second optical elements.

13. The optical system of claim 8, wherein the second optical element is located in a pupil region of the optical system.

14. The optical system of claim 8, wherein the optical system is a microlithography objective.

15. An optical system, comprising:
a housing having an interior, an exterior and an opening;
a first optical element;
a mount configured to secure the first optical element in the interior of the housing;
a holding structure disposed on the mount;
a second optical element disposed on the holding structure, the second optical element comprising a stiffening element; and
a holder configured to move between the interior of the housing and the exterior of the housing via the opening in the housing,
wherein:
the holder is configured to move the second optical element from the exterior of the housing to the interior of the housing; and
the optical system is a microlithography optical system.

16. The optical system of claim 15, wherein the holder is configured to move in a direction of an optical axis of the optical system.

17. The optical system of claim 15, wherein the second optical element is configured to compensate for imaging errors of the optical system.

18. The optical system of claim 15, wherein the second optical element has a maximum diameter that is at most 0.866 times an inner diameter of the housing.

19. The optical system of claim 15, further comprising a third optical element, wherein the first and third optical elements are non-replaceable optical elements, and the second optical element is a single optical element arranged between the first and second optical elements.

20. The optical system of claim 15, wherein the second optical element is located in a pupil region of the optical system.

21. The optical system of claim 15, wherein the optical system is a microlithography objective.

22. An optical system with an optical axis, the optical system comprising:
a housing having an interior, an exterior and an opening;
a first optical element;
a mount configured to secure the first optical element in the interior of the housing;
a second optical element disposed on a holding structure different from the mount or on the mount, the second optical element comprising a stiffening element; and
a holder configured to act on the second optical element or the stiffening agent,
wherein:
the holder is configured to move the second optical element from the exterior of the housing to the interior of the housing via the opening in the housing; and
the optical system is a microlithography optical system.

23. The optical system of claim 22, wherein the holder is configured to move between the interior of the housing and the exterior of the housing via the opening in the housing.

24. The optical system of claim 22, wherein the holder is configured to move in a direction along the optical axis between the interior of the housing and the exterior of the housing via the opening in the housing.

25. The optical system of claim 22, wherein the second optical element is configured to compensate for imaging errors of the optical system.

26. The optical system of claim 22, wherein the second optical element has a maximum diameter that is at most 0.866 times an inner diameter of the housing.

27. The optical system of claim 22, further comprising a third optical element, wherein the first and third optical elements are non-replaceable optical elements, and the second optical element is a single optical element arranged between the first and second optical elements.

28. The optical system of claim 22, wherein the second optical element is located in a pupil region of the optical system.

29. The optical system of claim 22, wherein the optical system is a microlithography objective.

* * * * *

UNITED STATES PATENT AND TRADEMARK OFFICE
CERTIFICATE OF CORRECTION

PATENT NO.       : 9,081,296 B2
APPLICATION NO.  : 14/499559
DATED            : July 14, 2015
INVENTOR(S)      : Jens Kugler et al.

It is certified that error appears in the above-identified patent and that said Letters Patent is hereby corrected as shown below:

On the title page

Page 2, Col. 2, line 1, under "OTHER PUBLICATIONS", delete "Adaptice" and insert -- Adaptive --.

Page 2, Col. 2, line 4, under "OTHER PUBLICATIONS", delete "at al," and insert -- et al., --.

Page 2, Col. 2, line 7, under "OTHER PUBLICATIONS", delete "at al.," and insert -- et al., --.

In the specification

Col. 2, line 53, delete "its," and insert -- its --.

Col. 4, line 23, after "same," insert -- a --.

Col. 5, line 9, delete "is" and insert -- 1a --.

Col. 5, line 20, delete "$P_a$" and insert -- $p_a$ --.

Signed and Sealed this
Fifteenth Day of March, 2016

Michelle K. Lee
*Director of the United States Patent and Trademark Office*